United States Patent
DiFoggio et al.

(10) Patent No.: US 11,768,178 B2
(45) Date of Patent: Sep. 26, 2023

(54) EMBEDDED ELECTRODE TUNING FORK

(71) Applicant: Baker Hughes Oilfield Operations LLC, Houston, TX (US)

(72) Inventors: Rocco DiFoggio, Houston, TX (US); Yi Liu, Houston, TX (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 514 days.

(21) Appl. No.: 16/804,954

(22) Filed: Feb. 28, 2020

(65) Prior Publication Data

US 2021/0270775 A1    Sep. 2, 2021

(51) Int. Cl.
| | |
|---|---|
| G01N 29/02 | (2006.01) |
| G01N 11/10 | (2006.01) |
| G01N 9/00 | (2006.01) |
| E21B 49/08 | (2006.01) |
| G01N 29/028 | (2006.01) |
| H10N 30/05 | (2023.01) |
| H10N 30/50 | (2023.01) |
| H10N 30/063 | (2023.01) |
| H10N 30/082 | (2023.01) |
| H10N 30/30 | (2023.01) |
| H10N 30/87 | (2023.01) |
| H10N 30/853 | (2023.01) |

(52) U.S. Cl.
CPC ......... *G01N 29/022* (2013.01); *E21B 49/082* (2013.01); *G01N 9/002* (2013.01); *G01N 11/10* (2013.01); *G01N 29/028* (2013.01); *H10N 30/05* (2023.02); *H10N 30/063* (2023.02); *H10N 30/082* (2023.02); *H10N 30/302* (2023.02); *H10N 30/50* (2023.02); *H10N 30/8542* (2023.02); *H10N 30/8554* (2023.02); *H10N 30/874* (2023.02); *E21B 49/0875* (2020.05); *G01N 2009/006* (2013.01); *G01N 2291/02818* (2013.01); *G01N 2291/0427* (2013.01)

(58) Field of Classification Search
CPC .... G01N 29/022; G01N 9/002; E21B 49/082; E21B 49/0875
See application file for complete search history.

(56) References Cited

U.S. PATENT DOCUMENTS

| | | |
|---|---|---|
| 6,182,499 B1 | 2/2001 | McFarland |
| 6,393,895 B1 | 5/2002 | Matsiev |
| 6,401,519 B1 | 6/2002 | McFarland |
| 6,494,079 B1 | 12/2002 | Matsiev |

(Continued)

OTHER PUBLICATIONS

M. Fischeneder, M. Kucera, F. Hofbauer, G. Pfusterschmied, M. Schneider, U. Schmid, Q-factor enhancement of piezoelectric MEMS resonators in liquids, Sensors and Actuators B: Chemical, vol. 260, 2018, pp. 198-203 (Year: 2018).*

(Continued)

*Primary Examiner* — Jonathan Malikasim
(74) *Attorney, Agent, or Firm* — HOGAN LOVELLS US LLP

(57) ABSTRACT

A sensor for obtaining downhole data includes a first piezoelectric layer. The sensor also includes a second piezoelectric layer having a trench extending a depth below a surface of the second piezoelectric layer. The sensor also includes an electrode positioned within the trench. The first piezoelectric layer is directly coupled to the second piezoelectric layer.

20 Claims, 10 Drawing Sheets

(56) References Cited

U.S. PATENT DOCUMENTS

| | | | |
|---|---|---|---|
| 6,904,802 B2 | 6/2005 | Fujimoto | |
| 6,938,470 B2 | 9/2005 | DiFoggio | |
| 7,162,918 B2 | 1/2007 | DiFoggio | |
| 7,317,989 B2 | 1/2008 | DiFoggio | |
| 7,322,803 B2 * | 1/2008 | Vogeley | F15B 15/18 |
| | | | 417/480 |
| 7,562,557 B2 | 7/2009 | Bennett | |
| 7,694,734 B2 | 4/2010 | DiFoggio | |
| 8,276,567 B2 | 10/2012 | Nakamura | |
| 8,878,548 B2 * | 11/2014 | DiFoggio | G01N 29/022 |
| | | | 324/633 |
| 9,038,443 B1 * | 5/2015 | Pace | G01N 29/036 |
| | | | 73/64.53 |
| 9,074,966 B2 | 7/2015 | Sanderlin | |
| 9,680,083 B2 * | 6/2017 | Hori | H10N 30/1051 |
| 10,241,223 B2 | 3/2019 | Bao | |
| 11,185,886 B2 * | 11/2021 | Campanella Pineda | |
| | | | B06B 1/0614 |
| 11,271,543 B2 * | 3/2022 | Han | H03H 9/173 |
| 2005/0262944 A1 | 12/2005 | Bennett et al. | |
| 2008/0011058 A1 * | 1/2008 | Lal | G01N 29/022 |
| | | | 73/54.23 |
| 2009/0120169 A1 * | 5/2009 | Chandler, Jr. | G01N 11/16 |
| | | | 29/25.35 |
| 2010/0162813 A1 * | 7/2010 | Chen | G01C 19/5628 |
| | | | 250/226 |
| 2011/0284949 A1 * | 11/2011 | Meng | H01L 51/057 |
| | | | 257/329 |
| 2012/0231218 A1 * | 9/2012 | Nakayama | H03H 3/007 |
| | | | 501/153 |
| 2016/0146680 A1 | 5/2016 | Bao | |
| 2019/0257730 A1 * | 8/2019 | Parlak | G01N 9/002 |
| 2021/0218384 A1 * | 7/2021 | Sui | H03H 9/02125 |
| 2021/0281243 A1 * | 9/2021 | Sui | H03H 9/0504 |

OTHER PUBLICATIONS

G. Michaeli, "Optimazation of quasi-phase-matched non-linear frequency conversion for diffusion boding applications," 2003, Applied Physics B, vol. 77, pp. 497-503.

M. R. Howlader, "Activation Process and Bonding Mechanism of Si/LiNbO3 and LiNbO3/LiNBO3 at Room Temperature," 2006, 207th ECS Meeting, abstract, 1 page.

V. Sivan, "Etching of lithium niobate using standard Ti indiffusion technique," 2007, Applied Physics Letters, vol. 91, 3 pages.

D. Tulli, "Room temperature direct bonding of LiNbO3 crystal layers and its application to high-voltage optical sensing," 2011, Journal of Micromechanics and Microengineering, pp. 1-7.

T. Tsuchiya, "Dry Etching and Low-Temperature Direct Bonding Process of Lithium Niboate Wafer for Fabricating Micro/Nano Channel Device," 2017, Transducers, Kaohsiung, Taiwan, Jun. 18-22, 2017, pp. 1245-1248.

M.R. Howlader, "Activation Process and Bonding Mechanism of Si/LiNbO3 and LiNbOy/LiNbO3 at Room Temperature," 2005-2006, Electrochemical Society Proceedings, pp. 319-325.

M. Sridhar, "Focused ion beam milling of microchannels in lithium niobate," 2012, Biomicrofluidics, vol. 6, 12 pages.

International Search Report and Written Opinion dated May 7, 2021 in corresponding PCT Application No. PCT/US2021/019755.

* cited by examiner

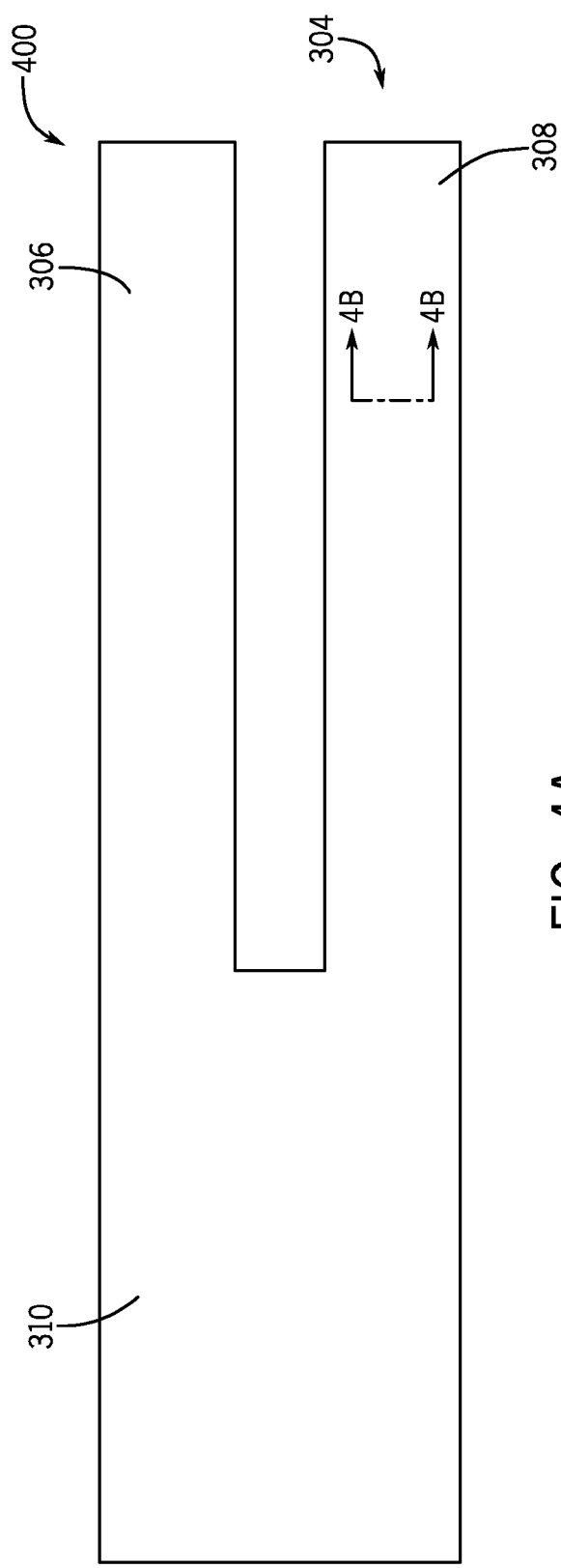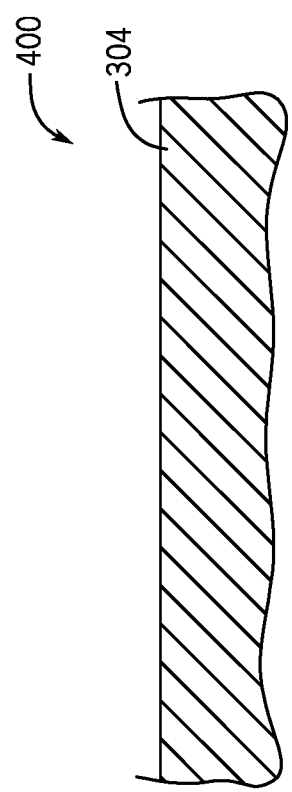
FIG. 4A
FIG. 4B

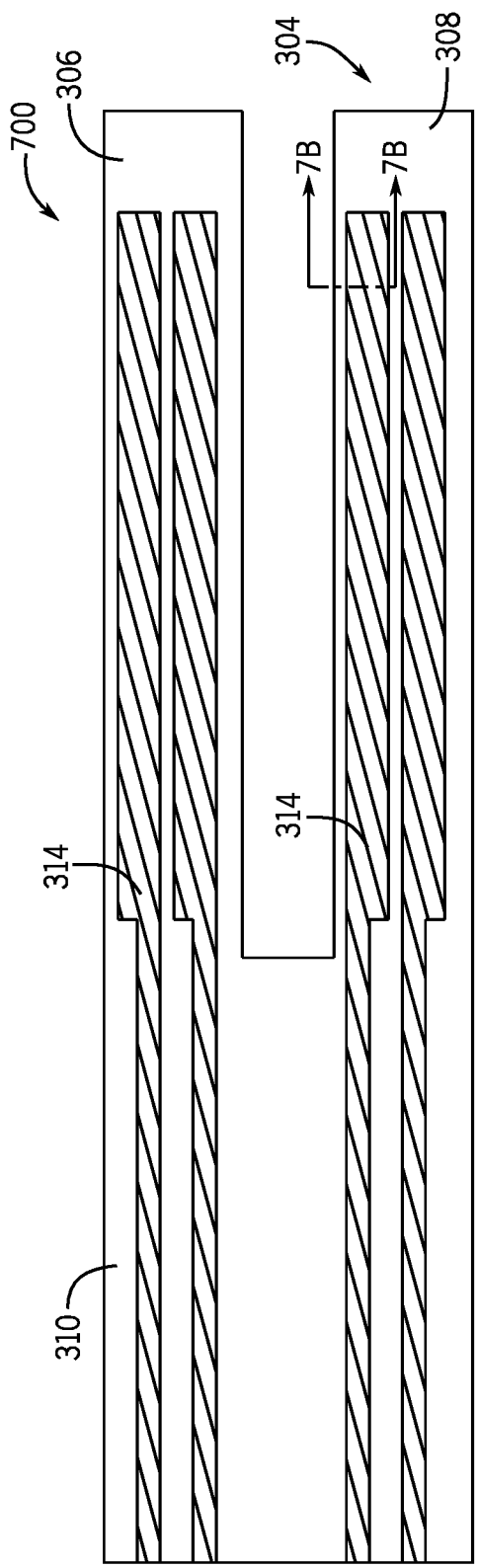
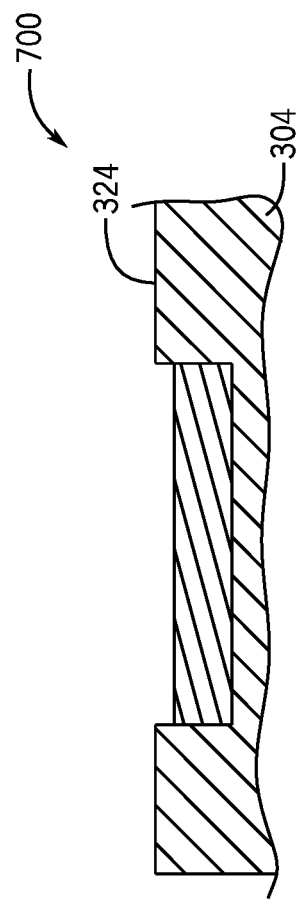
FIG. 7A
FIG. 7B

EMBEDDED ELECTRODE TUNING FORK

BACKGROUND

1. Field of the Disclosure

The present disclosure relates to a system and method of forming sensors for use in a downhole environment. More specifically, the present disclosure is directed toward systems and methods for generating directly bonded tuning fork sensors.

2. Description of Related Art

Oil and gas production may involve downhole measurement operations where various sensors are utilized to collect data for determining one or more wellbore properties. These sensors are exposed to harsh conditions, which may include high pressures, high temperatures, corrosive fluids, and the like. As a result, many sensors utilized for data collection may be single use or limited use. This is undesirable because certain operations may be improved with sensors that last longer, which may also reduce costs for providers and operators.

SUMMARY

Applicant recognized the limitations with existing systems herein and conceived and developed embodiments of systems and methods, according to the present disclosure, to improve the systems by utilizing a directly-bonded, embedded-electrode, downhole sensor, such as a piezoelectric tuning fork sensor.

In an embodiment, a sensor for obtaining downhole data includes a top piezoelectric layer. The sensor also includes a bottom piezoelectric layer having a trench extending a depth below a surface of the bottom piezoelectric layer. The sensor also includes an electrode positioned within the trench. The top piezoelectric layer is directly coupled to the bottom piezoelectric layer.

In an embodiment, an apparatus for obtaining downhole data includes a first piezoelectric layer. The apparatus also includes a second piezoelectric layer having at least one trench extending a depth below a surface of the second piezoelectric layer. The apparatus further includes an electrode positioned within the at least one trench. The first piezoelectric layer is directly coupled to the second piezoelectric layer.

In an embodiment, a system for obtaining data in a downhole environment includes a segment forming at least a portion of a downhole tool, the downhole tool being conveyable into a wellbore. The system also includes a tuning fork configured to evaluate at least one of viscosity or fluid density. The tuning fork includes a top layer, a bottom layer directly coupled to the top layer, an electrode positioned within the bottom layer, and a connector arranged at an end of the bottom layer.

In an embodiment, a system for obtaining data in a downhole environment includes a segment forming at least a portion of a downhole tool, the downhole tool being conveyable into a wellbore. The system also includes a tuning fork configured to evaluate at least one of viscosity or fluid density. The tuning fork includes a first layer, a second layer directly coupled to the first layer, an electrode positioned within the second layer, and a connector arranged at an end of the second layer.

In an embodiment, a method for forming a data collection component includes providing a bottom layer, the bottom layer having two tines and being formed from a piezoelectric material. The method also includes forming a trench in the bottom layer, the trench extending below a surface of the bottom layer. The method further includes filling at least a portion of the trench with an electrode. The method also includes preparing the surface of the bottom layer to a roughness below a threshold value. The method includes bonding a top layer, having two tines and being formed from the piezoelectric material, directly to at least a portion of the bottom layer.

In an embodiment, a method for forming a data collection component includes providing a second layer, the second layer being formed from a piezoelectric material. The method also includes forming at least one trench in the second layer, the at least one trench extending below a surface of the second layer. The method further includes filling at least a portion of the at least one trench with an electrode. The method also includes preparing the surface of the second layer to a roughness below a threshold value. The method includes bonding a first layer, formed from the piezoelectric material, directly to at least a portion of the second layer.

BRIEF DESCRIPTION OF DRAWINGS

The present technology will be better understood on reading the following detailed description of non-limiting embodiments thereof, and on examining the accompanying drawings, in which:

FIG. 4A is a top plan view of an embodiment of a tuning fork, in accordance with embodiments of the present disclosure;

FIG. 4B is a cross-sectional side view of an embodiment of a tuning fork, in accordance with embodiments of the present disclosure;

FIG. 7A is a top plan view of an embodiment of a tuning fork having an embedded electrode, in accordance with embodiments of the present disclosure;

FIG. 7B is a cross-sectional side view of an embodiment of a tuning fork having an embedded electrode, in accordance with embodiments of the present disclosure;

DETAILED DESCRIPTION

Figure 1:
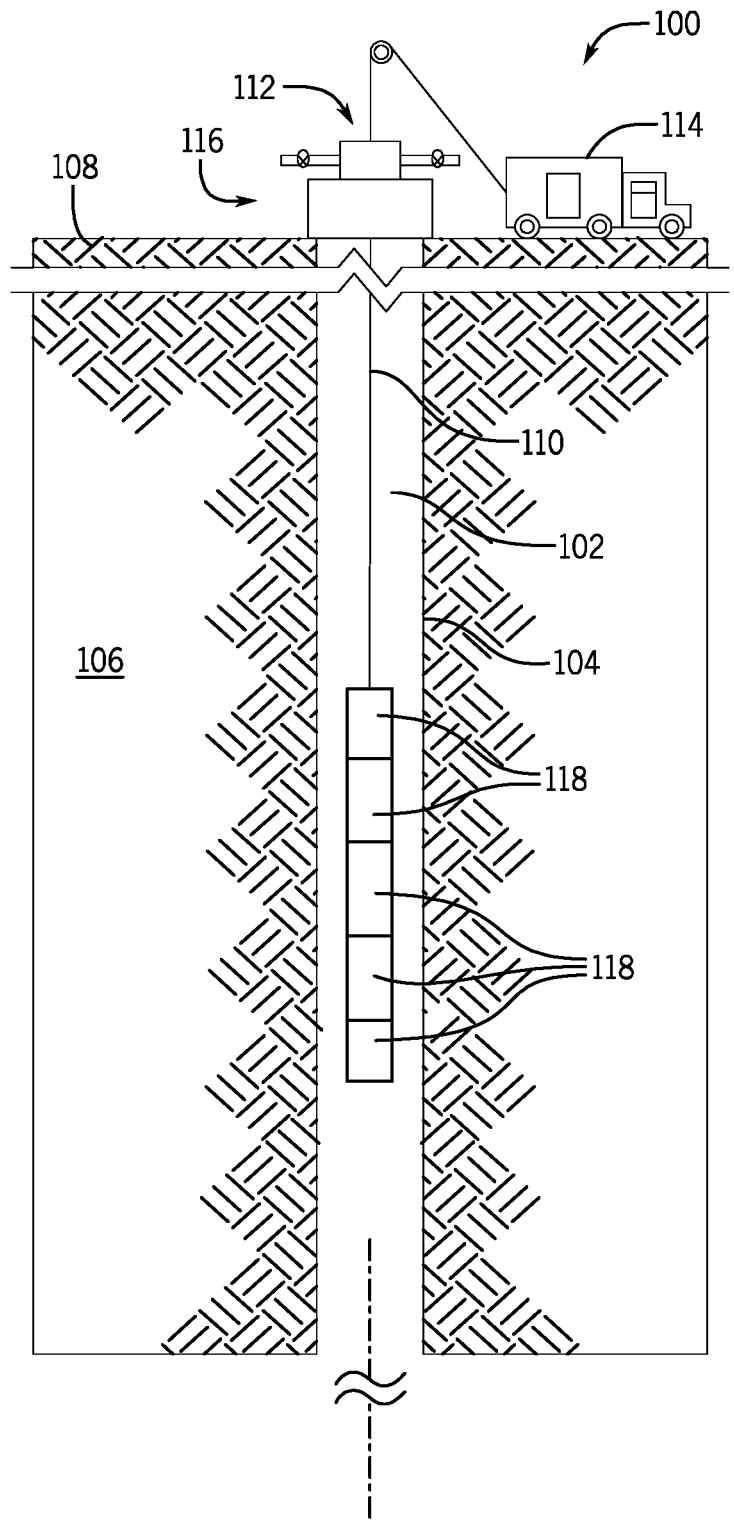
FIG. 1 is a cross-sectional side view of an embodiment of an wellbore system, in accordance with embodiments of the present disclosure.

The foregoing aspects, features, and advantages of the present disclosure will be further appreciated when considered with reference to the following description of embodiments and accompanying drawings. In describing the embodiments of the disclosure illustrated in the appended drawings, specific terminology will be used for the sake of clarity. However, the disclosure is not intended to be limited to the specific terms used, and it is to be understood that each specific term includes equivalents that operate in a similar manner to accomplish a similar purpose. Additionally, references numerals may be reused for similar features between figures, however, such use is not intended to be limiting and is for convenience and illustrative purposes only.

When introducing elements of various embodiments of the present disclosure, the articles "a", "an", "the", and "said" are intended to mean that there are one or more of the elements. The terms "comprising", "including", and "having" are intended to be inclusive and mean that there may be additional elements other than the listed elements. Any examples of operating parameters and/or environmental conditions are not exclusive of other parameters/conditions of the disclosed embodiments. Additionally, it should be understood that references to "one embodiment", "an embodiment", "certain embodiments", or "other embodiments" of the present disclosure are not intended to be interpreted as excluding the existence of additional embodiments that also incorporate the recited features. Furthermore, reference to terms such as "above", "below", "upper", "lower", "side", "front", "back", or other terms regarding orientation or direction are made with reference to the illustrated embodiments and are not intended to be limiting or exclude other orientations or directions.

Embodiments of the present disclosure are directed toward a downhole sensor component, such as a tuning fork, that includes directly bonded piezoelectric materials along with an embedded electrode. As a result, the tuning fork provides improvements over other designs that utilize a bonding layer, which may be formed from a dissimilar material, such as silicon dioxide. In various embodiments, a top and bottom layer formed from the same material are integrally bonded together. The bottom layer may undergo one or more processes to form a trench and embed an electrode within the bottom layer (e.g., below a surface of the bottom layer). As a result, subsequent bonding of the top layer may be performed between the top layer and the bottom layer. Accordingly, the likelihood of fluid ingress to the electrodes through a dissimilar bonding layer may be reduced.

Current embedded-electrode tuning forks used as fluid density and viscosity sensors may be made of Lithium Niobate, but other piezoelectric materials could also be used such as Gallium Phosphate, which has very little temperature dependence, or lead zirconate titanate (PZT). These embedded electrode forks are typically formed with electrodes sandwiched between two piezoelectric layers using a bonding layer, such as Silicon Dioxide. Embodiments of the present disclosure eliminate the Silicon Dioxide bonding layer between the upper and lower Lithium Niobate (or other piezoelectric material) halves because Silicon Dioxide dissolves slowly in hot water or hot saltwater, thereby permitting shorting of the internal electrodes as water or saltwater eats away at the "grout" seal around all of the fork-sandwich edges. Prior art used elevated electrodes on a piezoelectric wafer, which were covered with an overlayer of Silicon Dioxide to a height above that of the electrodes, then polished back down to the height of the electrodes before bonding it to the other piezoelectric wafer. To eliminate this Silicon Dioxide layer, this improvement uses recessed electrodes that are prepared by first trenching grooves for the electrodes using focused ion beam milling, dry reactive ion etching, or some other technique. Next, embodiments include filling these grooves with a conductive metal such as titanium, aluminum, or gold or with a semiconductive material such as indium tin oxide to create recessed electrodes instead of the current elevated electrodes. With no elevated electrodes, there is no need to create an elevated flat surface by applying a Silicon Dioxide layer and then polishing it down flat to the height of the electrode and then using this Silicon Dioxide as the bonding layer between the upper and lower Lithium Niobate wafer halves. Instead, embodiments bond Lithium Niobate directly to Lithium Niobate for a strong, grout-free seal. Lithium Niobate is stable in downhole fluids at downhole temperatures.

Further improvements include routing the internal electrodes between the upper and lower fork halves out to the end of the fork past a high-pressure seal around the fork. Prior art routes these electrodes to locations underneath laser-drilled holes in the face of the top layer of the fork for subsequent wire connections with conductive epoxy and these connections are then be covered with nonconductive elastomer seal (which degrades after long fluid exposure) to prevent electrical shorting (because the face of the fork is exposed to the downhole fluids) and this elastomer is soft and flexible enough not to damp the fork resonance. As described herein, routing to the end of the fork makes electrical connections easier and these connections are no longer exposed to downhole fluids and it improves high-pressure sealing because one does not have to seal around protruding wires using elastomer. Instead, the fork end slides into a close-fitting mounting sleeve and is sealed by a thin ring of elastomer or an O-ring-like seal, which has less area exposed to downhole fluids and can be made of a harder, less flexible elastomer.

FIG. 1 is a schematic cross-sectional view of an embodiment of a wellbore system 100 including a downhole tool 102 arranged within a wellbore 104 formed in a formation 106. The downhole tool 102 is lowered from a surface location 108 via a conveyance system, such as the illustrated wireline 110. In various embodiments, the electric wireline may transmit electric signals and/or energy from the surface location 108 into the wellbore, for example to provide operational power for the tool 102 and/or to transmit data, such as data obtained from sensors arranged on the tool 102. In various embodiments, the tool 102 may be utilized to perform downhole logging operations, such as an imaging tool, a resistivity tool, a nuclear tool, or any other logging tool that may be used in a downhole environment. It should be appreciated that embodiments exist where the downhole tool 102 is deployed with any other type of conveyance means, including coiled tubing, pipes, cable, and slickline. That is, embodiments of the present disclosure may be utilized in other scenarios, such as measurement while drilling, production logging, and the like.

The wellbore system 100 includes a wellhead assembly 112, shown at an opening of the wellbore 104, to provide pressure control of the wellbore 104 and allow for passage of equipment into the wellbore 104, such as the cable 110 and the tool 102. In this example, the cable 110 is a wireline being spooled from a service truck 114. The wellhead assembly 112 may include a blowout preventer (BOP) 116 (e.g., pressure control device).

In various embodiments, the downhole tool 102 includes a number of segments 118, which may represent different devices or sensors utilized to obtain information from the downhole environment. By way of example only, one segment 118 may include a piezoelectric density and viscosity sensor, such as a tuning fork. The tuning fork may be exposed to wellbore fluids, such as hot water, salt water, corrosive fluids, hydrocarbons, and the like. As a result, a life of the sensor may be minimized due to the operating conditions. As will be described below, one problem associated with existing tuning forks is a bonding layer between ferroelectric or piezoelectric material layers. This bonding layer may be utilized to combine two layers to embed an electrode within the fork. Intrusion into the bonding layer, for example by salt water or hot water, may damage or short the internal electrodes. Embodiments of the present disclosure are directed toward improved sensors, such as tuning forks, that are better suited for the downhole environment.

Figure 2A:
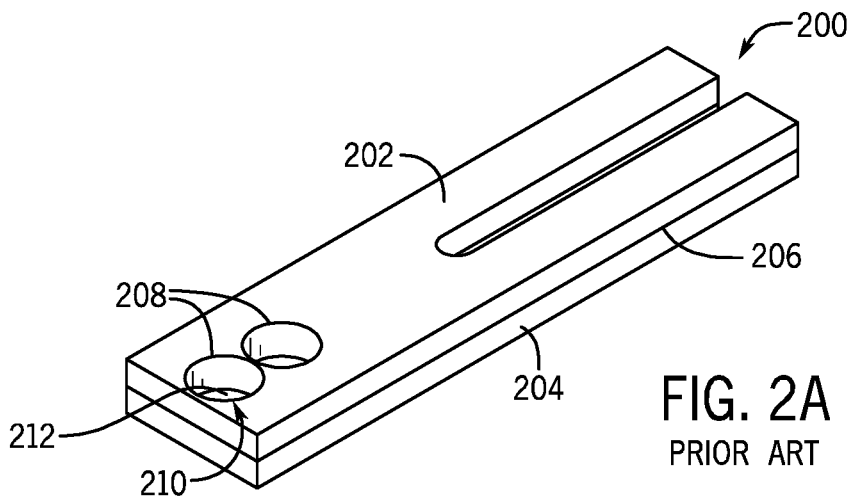
FIG. 2A is a perspective view of a prior art tuning fork.

FIG. 2A is a schematic view of a prior art tuning fork 200, which may be manufactured using traditional methods, such as using a bonding layer and having raised electrodes between layers of the tuning fork 200. The illustrated tuning fork 200 includes a top layer 202 (e.g., first layer) and a bottom layer 204 (e.g., second layer) that are coupled together via a bonding layer 206. The top and bottom layers 202, 204 are formed from a piezoelectric material, such as Lithium Niobate. However, other piezoelectric materials may also be considered, such as Gallium Phosphate, PZT, and the like. The bonding layer, however, may be formed from materials such as Silicon Dioxide.

The tuning fork 200 further includes apertures 208 extending through at least the top layer 202 to an exposed area 210 of the bottom layer 204. The exposed area 210 may include an electrode 212 that is positioned between the top layer 202 and the bottom layer 204, for example, within the bonding layer 206. In operation, leads may be coupled to the electrode 212 via the apertures 208 to facilitate transmission of information to the downhole tool, which may then be transmitted to an uphole location, stored on local memory, or the like.

In operation, the tuning fork 200 is positioned within an annulus of the wellbore and is exposed to wellbore fluids, such as hydrocarbons, hot water, salt water, and the like. Such exposure reduces the useful life of the sensor for a variety of reasons. First, thermal coefficients of expansion are different between the top and bottoms layers 202, 204 and the bonding layer 206. As a result, stresses may be formed at bonding locations along the tuning fork 200. These stresses may lead to fluid ingress, which may cause failures. Moreover, silicon dioxide may degrade when exposed to hot water or salt water, among other fluids, and as a result, lead to fluid ingress. Furthermore, the apertures 208 form an additional pathway for fluid ingress and create a weak spot in the tuning fork 200. Additionally, the structural problems are also accompanied by manufacturing concerns. The number of steps utilized to prepare the layers 202, 204, arrange the electrode 212, add the bonding layer 206, machine the apertures 208, and the like are time consuming, expensive, and may cause potential errors at each step. Embodiments of the present disclosure, however, overcome these problems by removing the bonding layer, embedding the electrode within one of the top layer or the bottom layer, and directly bonding the top layer to the bottom layer, among other improvements.

Figure 2B:
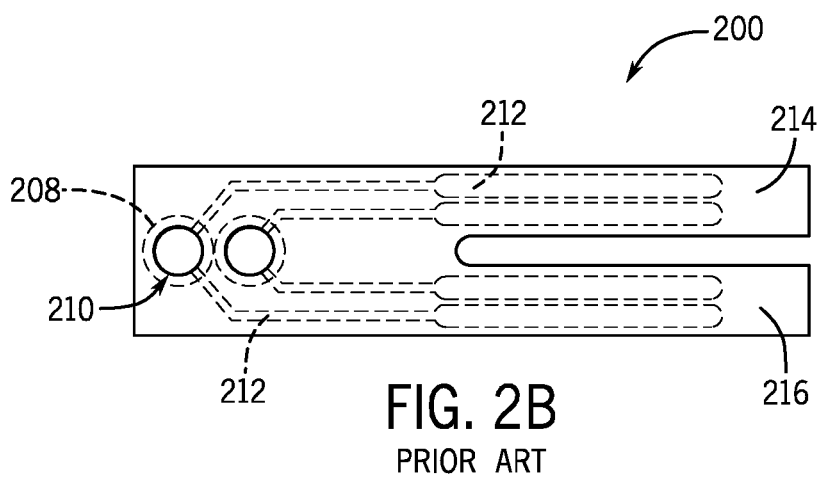
FIG. 2B is a top plan view of a prior art tuning fork.
Figure 2C:
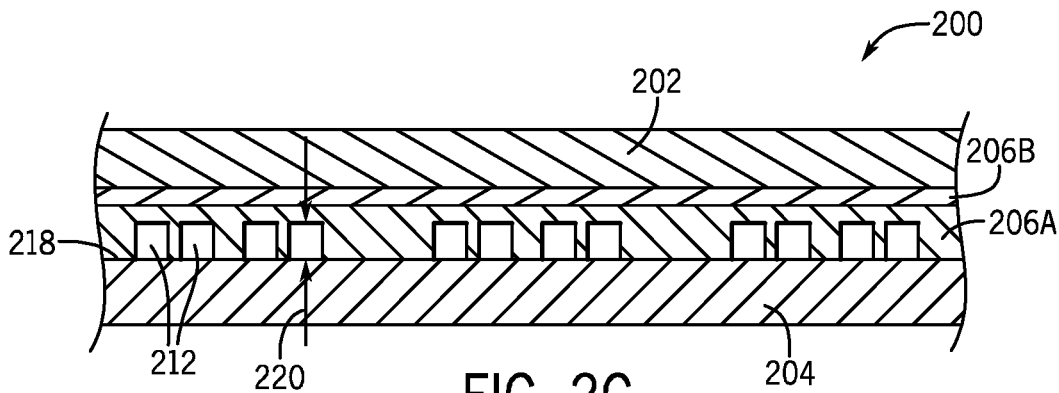
FIG. 2C is a cross-sectional side view of a prior art tuning fork.

FIGS. 2B and 2C provide additional views to illustrate the problems associated with the prior art tuning forks 200. For example, FIG. 2B is a top plan view that illustrates the electrodes 212 extending through tines 214, 216 of the tuning fork 200 toward the apertures 208. Additionally, FIG. 2C is a cross-sectional side view of the tuning fork 200. As shown, the bottom layer 204 includes the electrodes 212 arranged on a surface 218 of the bottom layer 204. As a result, the electrodes 212 are raised up above the surface 218 by a distance 220. Accordingly, additional material is added to cover the electrodes 212, such as the bonding layer 206. The illustrated prior art tuning fork 200 includes two bonding layers 206A, 206B, both formed from an oxide material, but it should be appreciated that other prior art tuning forks 200 include a single bonding layer 206. Thereafter, the top layer 202 is secured to the bottom layer 204 via the bonding layer 206. As described above, this bonding layer 206 may be damaged or degrade in the downhole environment, thereby reducing a useful life of the sensor. Systems and methods described herein overcome this problem by eliminating the bonding layer, among other improvements, to provide tuning forks having improved useful life, among other benefits.

Figure 3A:
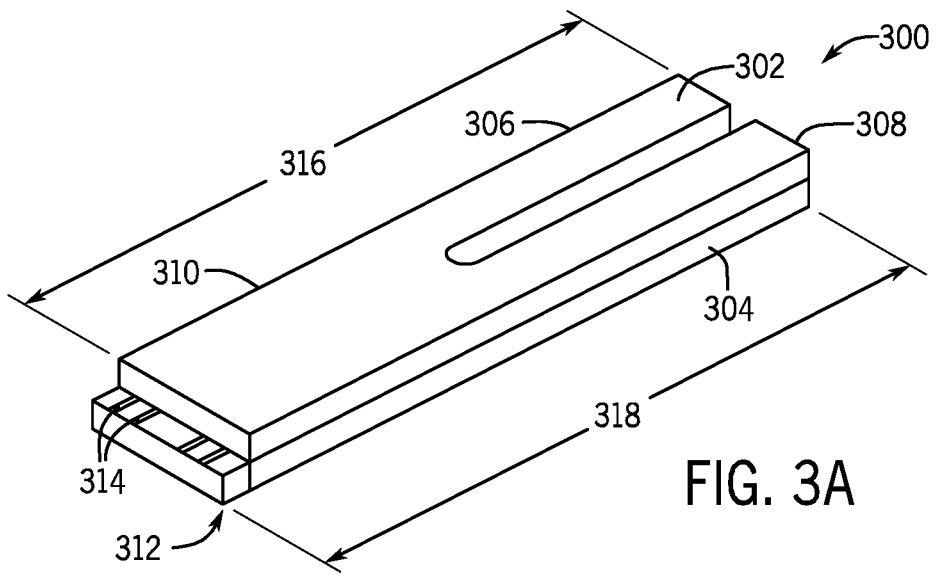
FIG. 3A is a perspective view of an embodiment of a tuning fork, in accordance with embodiments of the present disclosure.

FIG. 3A is a perspective view of an embodiment of tuning forking 300 (e.g., fork, downhole sensor component, etc.). The illustrated tuning fork 300 includes a top layer 302 (e.g., first layer) and a bottom layer 304 (e.g., second layer). As previously noted, recitation of "top" and "bottom" is for illustrative purpose only with respect to the illustrated embodiment and in various embodiments the top layer 302 may be arranged on the "bottom" and the bottom layer 304 may be arranged on the "top." As will be described below, the top layer 302 may be directly bonded to the bottom layer 304, thereby eliminating an intermediate bonding layer, such as the bonding layer present in prior art tuning forks. As a result, problems associated with disparate coefficients of thermal expansion, as well as ingress due to degradation of bonding materials, may be reduced and/or eliminated. As described above, the top and bottom layers 302, 304 are formed from a piezoelectric material, such as Lithium Niobate. However, other piezoelectric materials may also be considered, such as Gallium Phosphate, lead zirconate titanate (PZT), and the like.

It should be appreciated that the appearance of the tuning fork 300 including right angles is for illustrative purposes only and that, in various embodiments, one or more ends or angles may be rounded or otherwise smoothed out. Therefore, a length of the tines, thickness of the layers, and the like may be adjusted based on expected operating conditions.

The illustrated tuning fork 300 includes tines 306, 308 extending from a body portion 310. The body portion 310 includes a connector 312, which includes the exposed electrodes 314 embedded within the bottom layer 304. As a result, the illustrated embodiment eliminates the apertures 208 illustrated in FIG. 2A by providing the connector 312 for coupling the tuning fork 300 to various data collection systems. For example, as noted above, the connector 312 may be slotted into a mating system and secured via a seal or the like. The connector 312, in this embodiment, is formed due to a difference in length between the top layer 302 and the bottom layer 304. For example, the top layer 302 has a first length 316 and the bottom layer 304 has a second length 318. The first length 316 is less than the second length 318, thereby providing the connector 312.

Figure 3B:
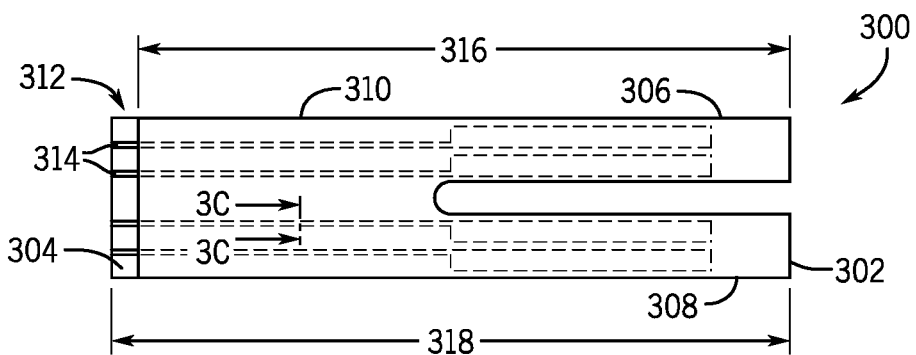
FIG. 3B is a top plan view of an embodiment of a tuning fork, in accordance with embodiments of the present disclosure.

FIG. 3B is a top plan view of the tuning fork 300 in which the electrodes 314 arranged within the bottom layer 304 (e.g., embedded within the bottom layer 304) are shown with hidden lines. The illustrated embodiment includes the electrodes 314 extending along the tines 306, 308 and terminating at the connector 312, where a data collection system may couple to the tuning fork 300. Furthermore, as shown, the connector 312 is visible and is not covered by the top layer 302 because the first length 316 is less than the second length 318. It should be appreciated that the appearance of the electrodes 314 (e.g., rectangular) is for illustrative purposes only and that the electrodes 314 may have a variety of different shapes.

Figure 3C:
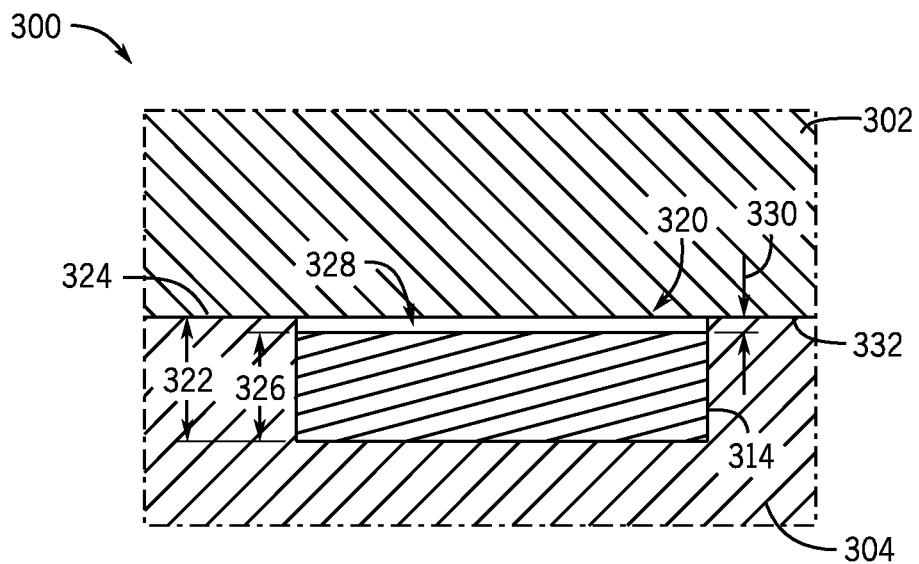
FIG. 3C is a cross-sectional side view of an embodiment of a tuning fork, in accordance with embodiments of the present disclosure.

FIG. 3C is a side cross-sectional view of tuning fork 300 illustrating the direct bonding between the top layer 302 and the bottom layer 304, as well as the embedded electrodes 314. In the illustrated embodiment, the bottom layer 304 includes trench 320 that receives the electrode 314. As shown, the trench 320 may be machined into the bottom layer 304, for example via one or more cutting processes, and has a depth 322. The depth 322 extends below a surface 324 of the bottom layer 304. Various methods may be utilized to form the trench 320, such as those described in "Etching of lithium niobate using standard Ti diffusion technique," by Vijay Sivan et al., Applied Physics Letters 91, 231921 (2007), which is hereby incorporated by reference in its entirety.

Figure 3D:
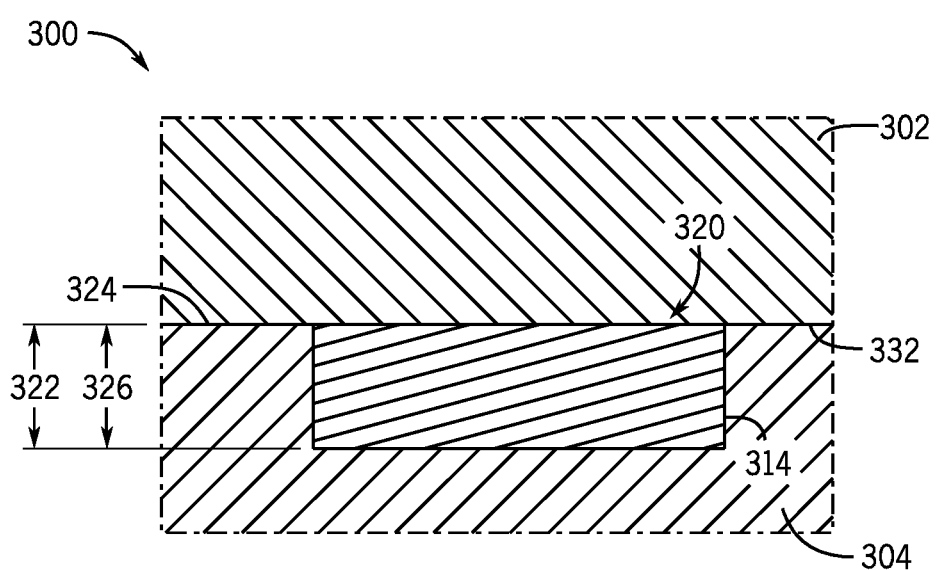
FIG. 3D is a cross-sectional side view of an embodiment of a tuning fork, in accordance with embodiments of the present disclosure.

FIG. 3D is a cross-sectional side view of an embodiment of the tuning fork 300 in which the gap 328 is removed and the electrode 314 substantially fills the trench 320. The electrode 314 may be deposited within the trench 320 and have a height 326, thereby providing a gap 328 between the top layer 302 and the bottom layer 304. It should be appreciated that the gap 328 is for illustrative purposes only, and that in various embodiments there may not be a gap 328 and the top layer 302 may be in direct contact with the electrode 314. The gap 328 extends for a height 330, which may be approximately 20 nanometers.

In the illustrated embodiment, an interface 332 between the top layer 302 and the bottom layer 304 is illustrated by a solid line. It should be appreciated that this solid line is not additional or added material, such as the bonding layer described above, but merely to represent a direct, bonded connection between the top layer 302 and the bottom layer 304. For example, direct bonding of lithium niobate to lithium niobate may be accomplished using a variety of methods, such as those described in "Optimization of quasi-phase-matched non-linear frequency conversion for diffusion bonding applications," by Michaeli et al., Applied Physics B 77, 497-503 (2003) (citing to Y. Tomita, M. Sugimoto, K. Eda, Applied Physics Letters 66, 1484 (1995)), the full disclosures of which are hereby incorporated by reference in their entirety. Accordingly, embodiments of the present disclosure have eliminated the problems of prior art tuning forks by eliminating the bonding layer, which may break down or otherwise degrade during operation, thereby improving operability of the tuning fork 300. Furthermore, configurations of the present embodiment may reduce a number of manufacturing steps for forming the tuning fork, thereby potentially reducing manufacturing costs.

FIGS. 4A-8B illustrate a manufacturing process that may be utilized to form the tuning fork 300. It should be appreciated that certain steps may be performed in an alternative order than those shown herein and that, in various embodiments, more or fewer steps may also be included. Furthermore, it should be appreciated that while FIGS. 4A, 5A, 6A, 7A, and 8A may illustrate the fork 300 being diced into a fork shape prior to the manufacturing steps, this arrangement is for illustrative purposes only. For example, embodiments of the present disclosure may be formed on a wafer and then diced into the fork shape. FIGS. 4A and 4B illustrate a starting step 400 for the tuning fork. FIG. 4A provides a top plan view of the bottom layer 304 while FIG. 4B provides a cross-sectional side view of the bottom layer 304. As illustrated, the bottom layer 304 has been shaped to include the tines 306, 308 and the body portion 310, however as noted above, this is for illustrative purposes and the shaping of the fork 300 may be completed at a later time, for example, from a wafer. In various embodiments, the surface 324 has been machined or prepared to a particularly selected roughness. The illustrated bottom layer 304 is prepared for trenching.

Figure 5A:
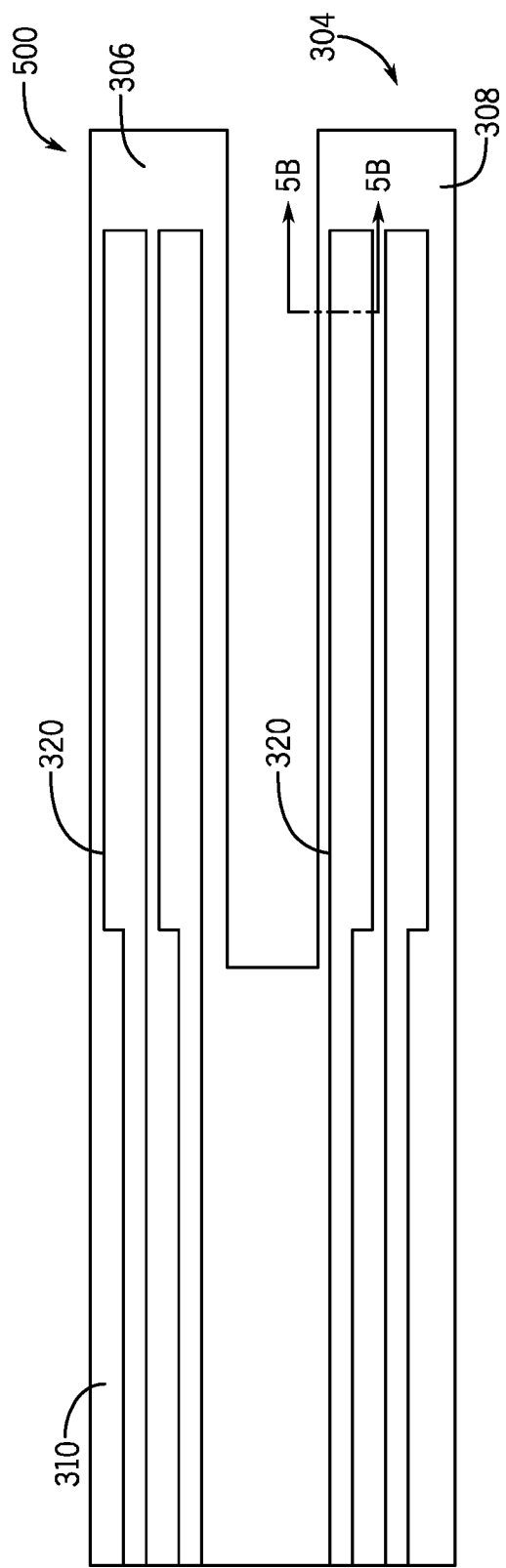
FIG. 5A is a top plan view of an embodiment of a tuning fork having a trench, in accordance with embodiments of the present disclosure.
Figure 5B:
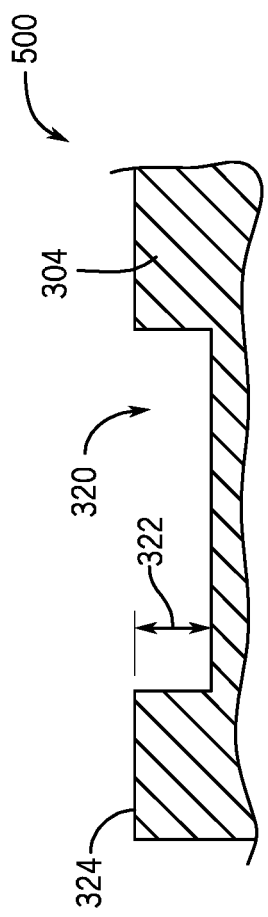
FIG. 5B is a cross-sectional side view of an embodiment of a tuning fork having a trench, in accordance with embodiments of the present disclosure.

FIGS. 5A and 5B illustrate a trenching step 500 for the tuning fork. FIG. 5A provides a top plan view of the bottom layer 304 while FIG. 5B provides a cross-sectional side view of the bottom layer 304. As illustrated, the trench 320 is formed in the bottom layer 304 such that the trench 320 extends below the top surface 324 by the depth 322. The depth 322 may be particularly selected based on expected operating conditions, manufacturing limitations, and the like.

Figure 6A:
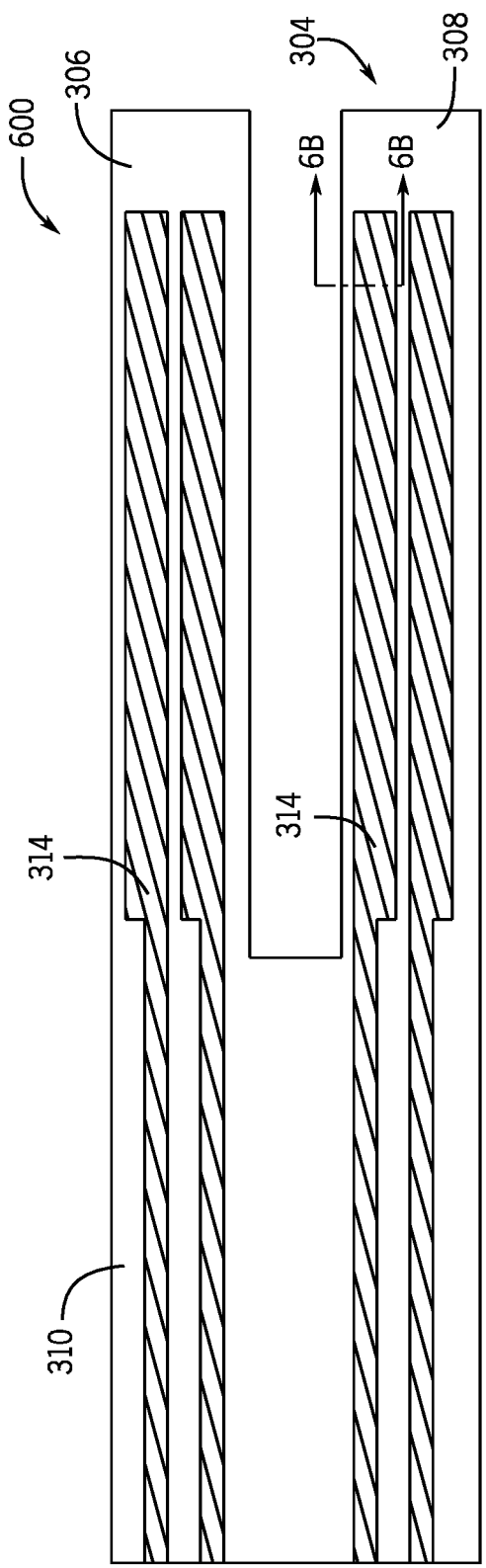
FIG. 6A is a top plan view of an embodiment of a tuning fork having an embedded electrode, in accordance with embodiments of the present disclosure.
Figure 6B:
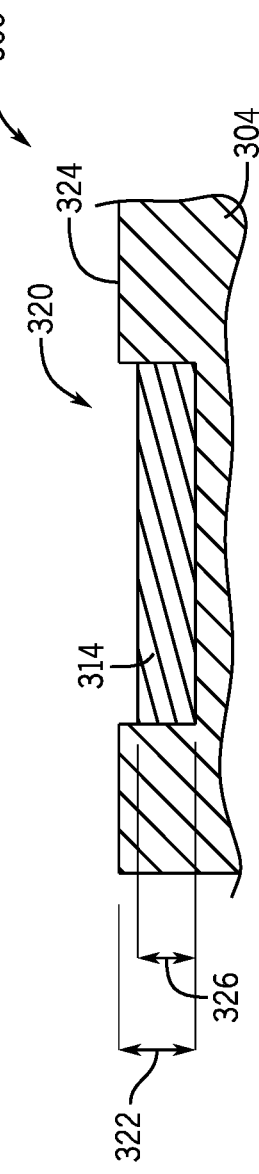
FIG. 6B is a cross-sectional side view of an embodiment of a tuning fork having an embedded electrode, in accordance with embodiments of the present disclosure.

FIGS. 6A and 6B illustrate a filling step 600 for the tuning fork. FIG. 6A provides a top plan view of the bottom layer 304 while FIG. 6B provides a cross-sectional side view of the bottom layer 304. As illustrated, the trench 320 is filled, at least partially, with the electrode 314. It should be appreciated that the electrode 314 may not fill the entire trench 320. For example, as shown in FIG. 6B, the electrode height 326 may be less than the trench depth 322, which forms the gap 328. However, in other embodiments, the trench depth 322 and the electrode height 326 may be substantially equal. Furthermore, the electrode 314 may not fill the electrode 314 in other dimensions. That is, the electrode 314 may not fill a width or length of the trench 320.

FIGS. 7A and 7B illustrate a polishing step 700. For example, in various embodiments, bonding the top layer 302 to the bottom layer 304 may be facilitated by having a low roughness for each surface, such as a roughness below approximately 3 angstroms. As a result, the polishing process may be utilized to reduce the surface roughness of the surface 324. Moreover, while not illustrated in FIGS. 7A and 7B, similar polishing may occur with the top surface 302.

Figure 8A:
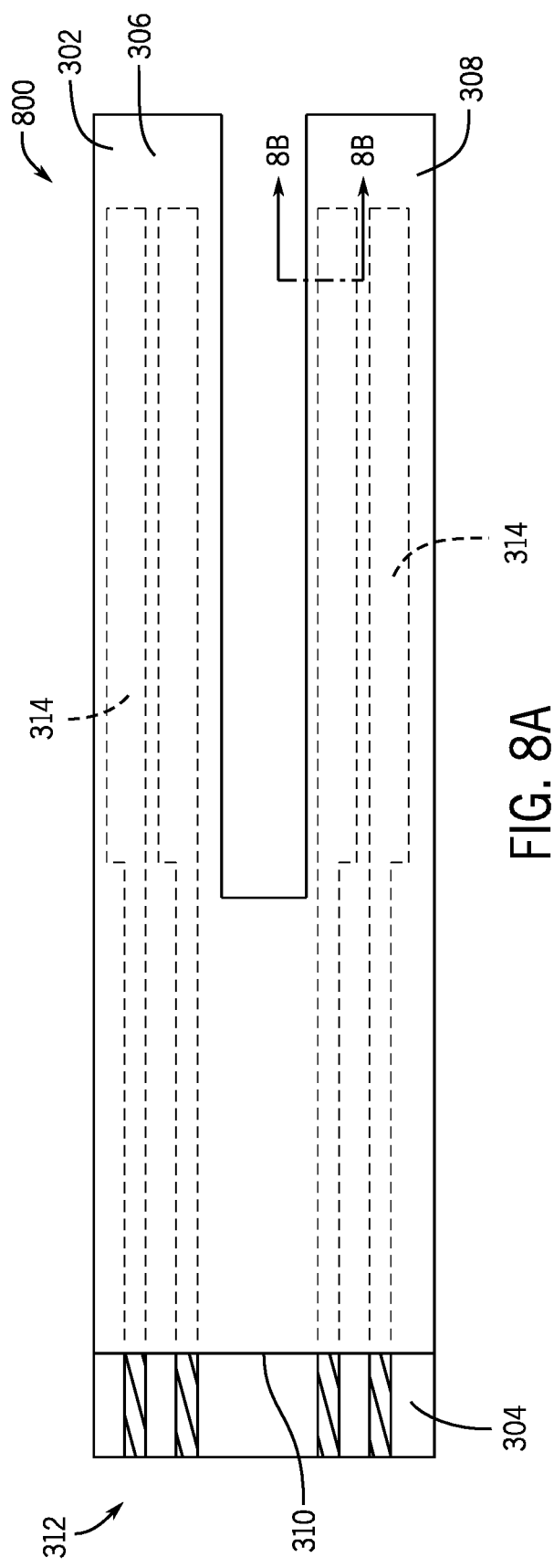
FIG. 8A is a top plan view of an embodiment of a tuning fork being directly bonded and having an embedded electrode, in accordance with embodiments of the present disclosure.
Figure 8B:
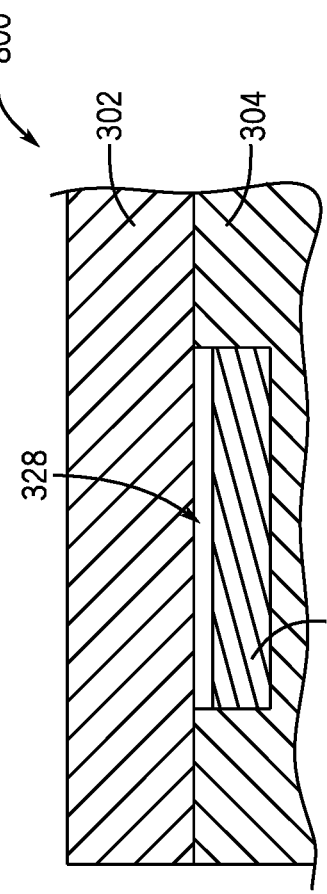
FIG. 8B is a cross-sectional side view of an embodiment of a tuning fork being directly bonded and having an embedded electrode, in accordance with embodiments of the present disclosure.

FIGS. 8A and 8B illustrate a bonding step 800. The top layer 302 is bonded to the bottom layer 304, for example using one or more processes described herein. The illustrated electrodes 314 are shown through the top layer 302 with hidden lines. As shown, the connector 312 is present due to the different in length between the top layer 302 and the bottom layer 304. The bonding may be a direct bond between the top layer 302 and the bottom layer 304, which may be stronger and less permeable than a bond using an intermediate material, such as the silicon dioxide bonding layer used in prior art tuning forks. Furthermore, bonding the same materials together eliminates problems using materials with different coefficients of thermal expansion. Accordingly, an improved tuning fork may be formed.

Figure 9:
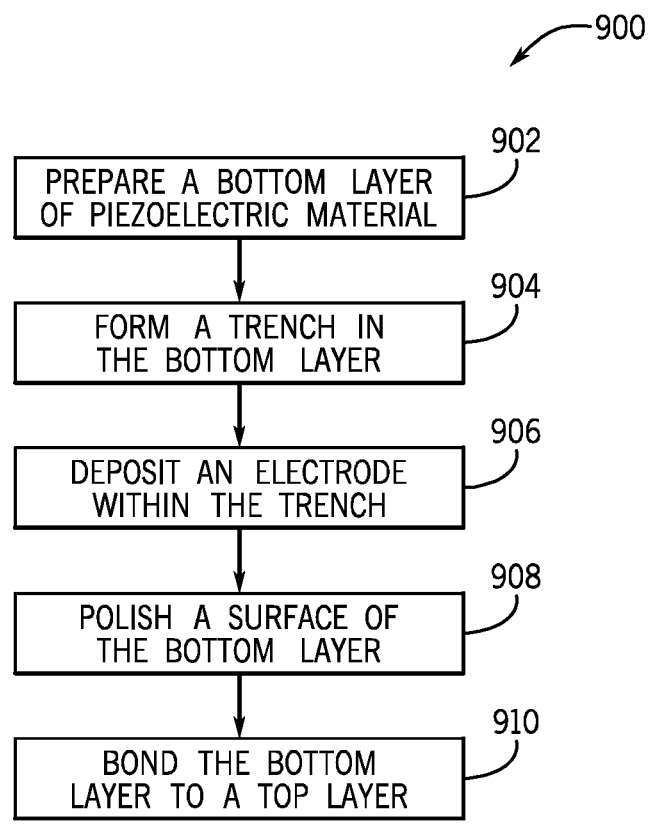
FIG. 9 is a flow chart of an embodiment of a method for forming a tuning fork, in accordance with embodiments of the present disclosure.

FIG. 9 is a flow chart of an embodiment of a method 900 for forming a downhole sensor component, such as a tuning fork. It should be appreciated for this method, and any methods described herein, that the steps may be performed in any order or in parallel, unless otherwise specifically stated. This example begins by preparing a bottom layer of piezoelectric material 902. For example, the bottom layer may have one or more surface treatments to prepare the piezoelectric material for subsequent operations. Furthermore, in various embodiments, the bottom layer may be sized such that a bottom layer thickness is approximately half of a total fork thickness (e.g., the bottom layer and the top layer bonded together). However, it should be appreciated that having the bottom layer be approximately half the total fork thickness is by way of example only. For example, the bottom layer may be more than half the thickness or less than half the thickness. A trench may be formed in the bottom layer 904. For example, a trench may be cut to a depth below the surface of the bottom layer. In various embodiments, the trench may extend for a distance along the bottom surface.

An electrode is deposited within the trench 906. For example, an electrode may be laid within the trench. In certain embodiments, the electrode has a height that is less than a depth of the trench to form a gap within the trench between a top of the electrode and the surface of the bottom layer. However, in other embodiments, the electrode may extend to the surface. One or more surface treatments, such as polishing, may be performed 908. In various embodiments, a low surface roughness may be desirable for subsequent bonding operations where the bottom layer is bonded to a top layer 910. In various embodiments, the bonding operation is a direct bonding operation between the top and bottom layer where both of the top and bottom layer are the same piezoelectric material. In this manner, the electrode may be embedded within piezoelectric material without having a dissimilar material utilized to bond the top and bottom layer together. Thereafter, the bonded-wafers (e.g., bottom layer bonded to the top layer) may be diced into individual forks.

The foregoing disclosure and description of the disclosed embodiments is illustrative and explanatory of various embodiments of the present disclosure. Various changes in the details of the illustrated embodiments can be made within the scope of the appended claims without departing from the true spirit of the disclosure. The embodiments of the present disclosure should only be limited by the following claims and their legal equivalents.

The invention claimed is:

1. An apparatus for obtaining downhole fluid density and viscosity, comprising:
   a first piezoelectric layer;
   a second piezoelectric layer having at least one trench extending a depth below a surface of the second piezoelectric layer;
   an electrode positioned within the at least one trench; and
   a gap between the electrode and the first piezoelectric layer;
   wherein the first piezoelectric layer and the second piezoelectric layer are formed from a common material and are directly bonded together to form a seal between the first piezoelectric layer and the second piezoelectric layer to block fluid ingress into the at least one trench.

2. The apparatus of claim 1, further comprising:
   a connector at an end of the second piezoelectric layer, the connector formed by an exposed portion of the second piezoelectric layer, wherein a first length of the first piezoelectric layer is less than a second length of the second piezoelectric layer.

3. The apparatus of claim 2, wherein the electrode is exposed at the connector.

4. The apparatus of claim 1, wherein the trench depth is greater than an electrode height.

5. The apparatus of claim 1, wherein the trench depth is substantially equal to an electrode height.

6. The apparatus of claim 1, wherein the respective piezoelectric materials include at least one of Lithium Niobate, Gallium Phosphate, or lead zirconate titanate (PZT).

7. The apparatus of claim 1, wherein the direct bonding between the first piezoelectric layer and the second piezoelectric layer is absent an intermediate bonding layer.

8. The apparatus of claim 1, wherein a respective roughness for respective bonding surfaces of the first piezoelectric layer and the second piezoelectric layer is less than 3 angstroms.

9. A system for obtaining in a downhole environment a fluid density and a viscosity, comprising:
   a segment forming at least a portion of a downhole tool, the downhole tool being conveyable into a wellbore;
   a tuning fork, forming at least a portion of the segment, configured to evaluate at least one of viscosity or fluid density in the downhole environment, comprising:
   a first layer formed from a piezoelectric material;
   a second layer formed from the piezoelectric material directly bonded to the first layer to form a seal between the first layer and the second layer;
   an electrode positioned within the second layer;
   a gap formed between the electrode and the first layer; and
   a connector arranged at an end of the second layer.

10. The system of claim 9, wherein the connector includes an exposed area, not covered by the first layer, the exposed area providing access to the electrode.

11. The system of claim 9, wherein the piezoelectric material includes at least one of Lithium Niobate, Gallium Phosphate, or lead zirconate titanate (PZT).

12. The system of claim 9, wherein the electrode is positioned within at least one trench formed in the second layer.

13. The system of claim 12, wherein an electrode height is one of less than a trench depth or equal to trench depth.

14. The system of claim 9, further comprising:
   a data collection system secured to the connector, the data collection system electrically coupling to the electrode via the connector.

15. The system of claim 9, wherein a respective roughness for respective bonding surfaces of the first layer and the second layer is less than 3 angstroms.

16. A method for forming a downhole fluid density and viscosity tool, comprising:
   providing a second layer, the second layer being formed from a piezoelectric material;
   forming at least one trench in the second layer, the at least one trench extending below a surface of the second layer;

filling a portion of the at least one trench with an electrode;

preparing the surface of the second layer to a roughness below a threshold value;

bonding a first layer, formed from the piezoelectric material, directly to at least a portion of the second layer to form a seal between the first layer and the second layer to block fluid ingress into the at least one trench; and maintaining, prior to the bonding, a gap between the electrode and the first layer.

17. The method of claim 16, wherein bonding the first layer directly to at least the portion of the second layer is performed absent an intermediate bonding layer.

18. The method of claim 16, wherein a first layer length is less than a second layer length, further comprising:

forming a connector at an exposed area of the second layer, the exposed area being uncovered by the first layer.

19. The method of claim 16, wherein the piezoelectric material is at least one of Lithium Niobate, Gallium Phosphate, or lead zirconate titanate (PZT).

20. The method of claim 16, wherein the threshold value is less than 3 angstroms.

\* \* \* \* \*